(12) United States Patent
Atwell et al.

(10) Patent No.: US 6,280,793 B1
(45) Date of Patent: *Aug. 28, 2001

(54) ELECTROSTATIC METHOD AND APPARATUS FOR VAPORIZING PRECURSORS AND SYSTEM FOR USING SAME

(75) Inventors: David R. Atwell, Boise; Brian A. Vaartstra, Nampa, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/752,834

(22) Filed: Nov. 20, 1996

(51) Int. Cl.[7] .................................................... C23C 16/00

(52) U.S. Cl. ...................... 427/248.4; 118/726; 392/394; 392/399; 392/401

(58) Field of Search ............................ 118/726; 392/394, 392/398, 401; 427/248.1

(56) References Cited

U.S. PATENT DOCUMENTS

| | | |
|---|---|---|
| 4,791,273 | 12/1988 | Satoh et al. . |
| 4,993,361 * | 2/1991 | Unvala ................................. 118/715 |
| 5,224,202 * | 6/1993 | Arnold ................................. 118/726 |
| 5,277,938 | 1/1994 | Wegmann et al. . |
| 5,356,673 | 10/1994 | Schmitt et al. . |

(List continued on next page.)

FOREIGN PATENT DOCUMENTS

| | | |
|---|---|---|
| 0 058 571 | 8/1982 | (EP) . |
| 0 420 596 | 4/1991 | (EP) . |

OTHER PUBLICATIONS

"The Varex MKIII ELSK Outperforms Traditional HPLC Detectors for Performance, Versatility, and Convience", brochure by Alltech, 1 p., (Undated).

Binks, "Electrostatic spray painting equipment" Brochure pp. 2–3, 8, 12–13, 18 (prior to Nov. 20, 1996).

P. Singer, "Trends in Liquid Sources", *Semiconductor International*, 93–97 (Jun. 1993).

Nordson, "Versa–Spray® II Manual Powder System" Brochure, 2 pgs. (prior to Nov. 20, 1996).

V. Versteeg et al., "Metalorganic Chemical Vapor Deposition by Pulsed Liquid Injection Using an Ultrasonic Nozzle: Titanium dioxide on Sapphire from Titanium (IV) Isopropoxide", *J. Am. Ceram. Soc.*, 78, 2763–2768 (1995).

P. Wu et al., "Growth and Characterization of Gallium (III) Oxide Films", *Nat. Res. Bull.*, 25, 357–363 (1990).

*Primary Examiner*—Richard Bueker
(74) *Attorney, Agent, or Firm*—Mueting, Raasch & Gebhardt, P.A.

(57) ABSTRACT

A vaporizing apparatus for providing a vaporized precursor for a vapor deposition process includes a dispensing device for providing precursor spray having a first electrical charge into a vaporization zone. The apparatus further includes a heated element in the vaporization zone having a second electrical charge opposite of the first charge. The heated element vaporizes the precursor spray attracted thereto. The dispensing device may be an electrostatic spray device for spraying a powdered precursor, a mixture of powdered precursors, one or more powdered precursors cut with an inert filler material, one or more liquid precursors adsorbed on solid particles, one or more gas precursors adsorbed on solid particles, a liquid precursor, a mixture of liquid precursors, or one or more solid precursors dissolved in one or more solvents. A method of vaporizing precursors for vapor deposition processes includes providing a precursor spray having a first electrical charge. At least a portion of the precursor spray is vaporized using a heated element having a second electrical charge opposite of the first electrical charge.

24 Claims, 2 Drawing Sheets

U.S. PATENT DOCUMENTS

| | | | |
|---|---|---|---|
| 5,361,800 | 11/1994 | Ewing | 137/495 |
| 5,362,328 | 11/1994 | Gardiner et al. | 118/726 |
| 5,372,754 | 12/1994 | Ono | 261/142 |
| 5,383,970 | 1/1995 | Asaba et al. . | |
| 5,405,659 | 4/1995 | Fernandez . | |
| 5,419,924 | 5/1995 | Nagashima et al. . | |
| 5,421,895 | 6/1995 | Tsubouchi et al. | 118/726 |
| 5,447,569 | 9/1995 | Hiskes et al. . | |
| 5,451,258 | 9/1995 | Hillman et al. | 118/715 |
| 5,451,260 | 9/1995 | Versteeg et al. | 118/725 |
| 5,476,547 | 12/1995 | Mikoshiba et al. . | |
| 5,529,634 | 6/1996 | Miyata et al. . | |
| 5,835,677 * | 11/1998 | Li | 118/726 |
| 5,882,416 | 3/1999 | Van Buskirk et al. . | |

* cited by examiner

ELECTROSTATIC METHOD AND APPARATUS FOR VAPORIZING PRECURSORS AND SYSTEM FOR USING SAME

FIELD OF THE INVENTION

The present invention relates to vapor deposition processes and systems. More particularly, the present invention pertains to vaporization devices and methods for vaporizing chemical vapor deposition (CVD) precursors and for providing such vaporized precursors for use in CVD systems.

BACKGROUND OF THE INVENTION

Chemical vapor deposition (CVD) has been extensively used for preparation of films and coatings in semiconductor processing. CVD is a favored deposition process in many respects, for example, because of its ability to provide highly conformal and high quality films at relatively fast processing times. Further, CVD is beneficial in coating substrates of irregular shapes, including the provision of highly conformable films even with respect to deep contacts and other openings.

Metalorganic chemical vapor deposition (MOCVD), wherein organometallic precursors are utilized for depositing films, is highly dependent upon suitable organometallic precursors. Generally, gases or volatile liquid precursors are utilized for such processes as they can be easily delivered to the process as a vaporized material. Solid precursors are generally considered to be a poor choice due to difficulty of vaporizing, i.e., subliming, a solid at a controlled rate. However, there are many off-the-shelf solid precursors available, particularly solid organometallic precursors, which if they could be delivered effectively and reproducibly, could be used for CVD processes. Further, solid precursors are particularly useful in deposition of metal-based films, such as, for example, metal nitrides and metal silicides.

Typical CVD processes generally employ precursor sources in vaporization chambers that are separated from the process chamber wherein the deposition surface or wafer is located. For example, liquid precursors are typically placed in bubblers and heated to a temperature at which they vaporize, and the vaporized liquid precursor material is then transported by a carrier gas passing over the bubbler or through the liquid precursor. The vapors are then swept through a gas line to the process chamber for depositing a CVD film on a surface therein. Many techniques have been developed to precisely control this process. For example, the amount of material transported to the process chamber can be precisely controlled by the temperature of the liquid precursor reservoir and by the flow of the carrier gas bubbled through or passed over the reservoir.

However, similar techniques for solid precursors are not adequate for providing a vaporized solid precursor suitable for depositing CVD films. For illustration, similar techniques may include bulk sublimation of the solid precursor with transport of the vaporized solid precursor to the process chamber using a carrier gas in much the same way as the vaporized liquid precursor is transported. However, it is difficult to vaporize solid precursor at controlled rates such that a reproducible flow of vaporized solid precursor can be delivered to the process chamber.

Lack of control of solid precursor sublimation is, at least in part, due to the changing surface area of the bulk solid precursor as it is vaporized. Such a changing surface area when the bulk solid precursor is exposed to sublimation temperatures produces a continuously changing rate of vaporization, particularly for thermally sensitive compounds. This ever changing rate of vaporization results in a continuously changing and non-reproducible flow of vaporized solid precursor delivered for deposition in the process chamber. As a result, film growth rate and composition of such films on wafers in the process chamber deposited using such vaporized solid precursors cannot be controlled adequately and effectively. Therefore, it is important to precisely control the exposure of the solid precursors to elevated temperatures without bulk decomposition of the solid precursor material.

In addition to solid precursors being difficult to deliver to process chambers at a controllable and reproducible rate, liquid source materials for CVD are also, in many circumstances, difficult to deliver to process chambers. Liquid source materials have become widely utilized, at least in part due to the fact that in many circumstances CVD cannot be accomplished using compounds that are gaseous at ambient conditions. For example, liquid sources utilized in CVD include such sources as tetraethoxysilane (TEOS) used as a source of silicon to deposit silicon dioxide films, sources for use in deposition of titanium nitride films, and sources for depositing metal oxides (for example, tantalum oxide, niobium oxide, aluminum oxide, and titanium oxide), ferroelectric oxides, copper, and aluminum. Liquid sources used for doping by diffusion are typically organic sources, such as, for example, phosphorus oxychloride, phosphorus tribromide, phosphorus trichloride, and boron tribromide. Further, for depositing doped films by CVD (e.g., borophosphosilicate glass, borosilicate glass, phosphosilicate glass), common liquid sources include, for example, triethylborate, triethylphosphate, triethylphosphite, triisopropylborate, trimethylborate, trimethylphosphate, and trimethylphosphite. The liquid precursors listed above are listed for illustration only and there are many other liquid precursors too numerous to list and for which the present invention is applicable.

Liquid sources are so named because their vapor pressures are so low that they are liquids at room temperature. However, some materials, such as boron trichloride, have fairly high vapor pressures and are only barely in the liquid state at room temperature. The lower the material's vapor pressure, the more difficult it is to deliver to a CVD reactor or processing chamber. Many liquid sources can be delivered with existing bubbler technology where a carrier gas, typically nitrogen, is bubbled through the liquid to sweep some of the liquid source molecules into the processing chamber. Other liquid precursors, such as precursors for deposition of metal oxide films, due to their low vapor pressures, cannot be delivered with sufficient reproducibility with such bubbler delivery systems, particularly in device applications with small dimensions. For example, in such cases, bubbler delivery systems are not effective due to the fact that the flow of the liquid precursor is indirectly controlled via control of a carrier gas flow bubbled through the liquid precursor. Further, bubbler systems also have problems in delivering materials with very low vapor pressures which tend to condense or decompose near normal temperatures required for vaporization between the source of the liquid precursor and the processing chamber used for CVD, i.e., condense or decompose in a vaporization chamber prior to reaching the processing chamber.

One alternative to conventional bubbler technology is to provide a liquid precursor, such as a organometallic precursor, into a processing chamber utilizing an ultrasonic piezoelectrically driven nozzle which atomizes the liquid precursor and delivers a mist of droplets to the processing chamber. Further, in conventional systems, where liquid precursors are delivered to a vaporizer using mist generation, vaporization is typically carried out by contact with heated surfaces and then a carrier gas is used to deliver the vaporized liquid precursor to the processing chamber. However, such vaporizing devices for delivery systems suffer from the disadvantage of decomposition of the liquid precursors upon contact with the hot surfaces, or incomplete vaporization, which also yields inconsistent films grown under CVD conditions. For example, such decomposition may occur at the walls of a vaporization chamber.

For the above reasons, there is a need in the art for a vapor delivery system for delivering solid CVD precursors in a CVD process at a highly controllable rate and without bulk decomposition of a solid precursor material during vaporization. Further, there is also a need in the art to provide highly reproducible vaporization of liquid CVD precursors without decomposition of liquid precursors on the walls of, for example, a vaporization chamber. The present invention provides a vaporization apparatus and method, along with a system for use thereof, which overcomes such problems as described above and others that will be readily apparent to one skilled in the art from the description of the present invention below.

SUMMARY OF THE INVENTION

A vaporizing apparatus in accordance with the present invention for providing a vaporized precursor for a vapor deposition process is described. The apparatus includes a dispensing device for providing precursor spray having a first electrical charge into a vaporization zone. The apparatus further includes a heated element in the vaporization zone having a second electrical charge opposite of the first charge. The heated element vaporizes the precursor spray attracted thereto.

In one embodiment of the apparatus, the dispensing device is an electrostatic spray device for spraying a powdered precursor, a mixture of powdered precursors, one or more powdered precursors cut with an inert filler material, one or more liquid precursors adsorbed on solid particles, one or more gas precursors adsorbed on solid particles, a liquid precursor, a mixture of liquid precursors, or one or more solid precursors dissolved in one or more solvents.

In another embodiment of the vaporizing apparatus, the apparatus includes a detection device for detecting the concentration of unvaporized precursor spray. The detection device may also generate a signal representative of the concentration of unvaporized precursor spray with a controller being responsive to the signal representative of the detected concentration for initiating modification of a parameter of the vaporizing apparatus.

A method of vaporizing precursors for vapor deposition processes in accordance with the present invention is also described. The method includes providing a precursor spray having a first electrical charge. At least a portion of the precursor spray is vaporized using a heated element having a second electrical charge opposite of the first electrical charge.

In one embodiment of the method, the first electrical charge is applied to the precursor as it is sprayed into a vaporization zone. Further, a charged precursor spray is attracted to the heated element for vaporization thereby. In other embodiments of the method, the method further includes the step of controlling the vaporization by adjusting the temperature of the heated element and/or controlling the vaporization of a precursor spray by adjusting the pressure of the vaporization zone.

A vapor deposition system in accordance with the present invention includes an electrostatic spraying device for providing a precursor spray having a first electrical charge. A housing defining a vaporization zone includes a heated element therein. The heated element has a second electrical charge for attracting the precursor spray from the electrostatic spraying device and for vaporization of the precursor spray. A process chamber receives the vaporized precursor spray from the vaporization zone.

In one embodiment of the system, a directing device is utilized to direct the vaporized precursor from the vaporization zone into the process chamber. The directing device is the heated element which has the second charge and which attracts and vaporizes the precursor spray.

A method of controlling the vaporization of precursors for vapor deposition processes is also described. An electrically charged and heated element is used to attract thereto and to vaporize a precursor spray of opposite charge. The concentration of unvaporized precursor spray is detected and the vaporization of the precursor spray using the charged and heated element is controlled as a function of the detected concentration.

In one embodiment of the control method, the vaporization controlling step includes controlling one of a temperature of the heated element, the charge of the heated element, the charge of the precursor spray, a distance between the heated element and a dispensing device used for providing the spray, and the pressure of a vaporization chamber into which the precursor spray is sprayed and in which the precursor is vaporized.

DETAILED DESCRIPTION OF THE EMBODIMENTS

The present invention shall be described with reference to FIG. 1. Various alternative embodiments of the present invention shall be described further with reference to FIGS. 2–4. Generally, vapor deposition system 10 in accordance with the present invention includes a CVD precursor vaporization apparatus 12 that delivers a vaporized precursor to process chamber 14.

The present invention provides a highly reproducible vaporization of precursors for CVD processes. Further, the vaporization apparatus 12 converts the CVD precursor (e.g., a powdered precursor, a mixture of powdered precursors, one or more powdered precursors cut with an inert filler material, one or more liquid precursors adsorbed on solid particles, one or more gas precursors adsorbed on solid particles, a liquid precursor, a mixture of liquid precursors, or one or more solid precursors dissolved in one or more solvents) into vapor phase species which are suitable for CVD. Further, the present invention allows for the use of precursors that are sensitive to decomposition near the normal temperatures required for vaporization. The present invention permits for virtually no overspray of precursor in a vaporization chamber 18 of the vaporization apparatus 12, as shall be further described below, and therefore a known surface area for the precursor is vaporized and substantially no unreacted precursor can collect on vaporization chamber walls or other portions of the system 10 upon which such precursor may decompose.

Generally, the vaporization of the precursor is carried out by utilization of an electrostatic dispensing device 16 which provides a charged precursor spray into vaporization zone 20 defined by the vaporization chamber 18. A heated element 30 is electrically charged opposite of the charged precursor spray 17. The charged precursor spray is drawn to the oppositely charged heated element 30 and is flash vaporized thereby. The vaporized precursor is then provided to process chamber 14. As a result of the precursor spray being drawn to the charged heated element 30, there is substantially little unvaporized precursor spray in the vaporization zone 20 and therefore very little unvaporized precursor for collection on the walls of the vaporization chamber 18.

As utilized herein, precursor spray refers to sprayed particles, such as particles from a powdered precursor, a mixture of powdered precursors, one or more powdered precursors cut with an inert filler material, one or more liquid precursors adsorbed on solid particles, or one or more gas precursors adsorbed on solid particles. Further, precursor spray also refers to mist or microdroplets such as those formed from liquid precursors, a mixture of liquid precursors, or one or more solid precursors dissolved in one or more solvents.

Figure 1:
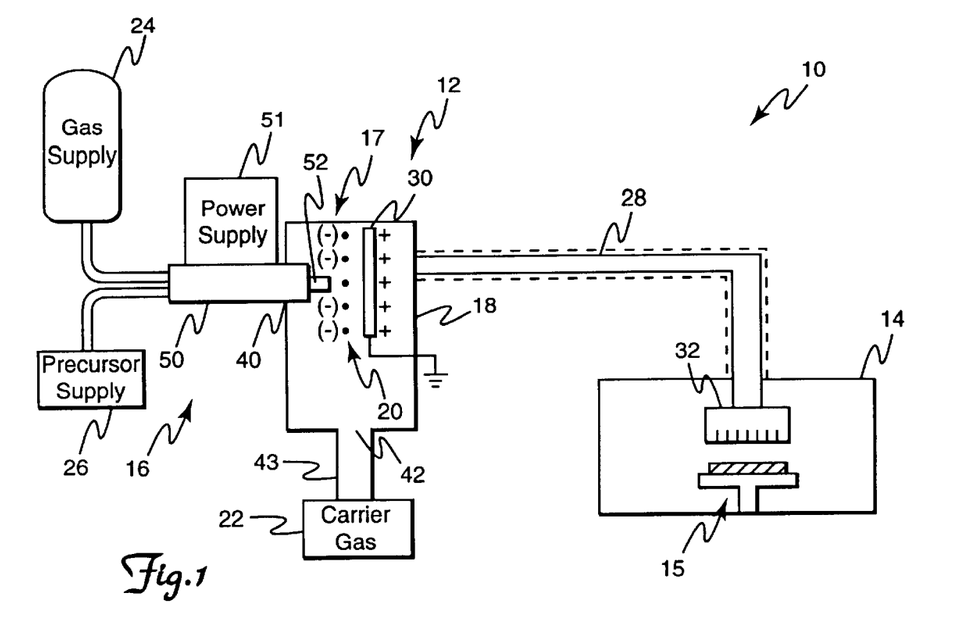
FIG. 1 is a block diagram illustration of a vapor deposition system including a CVD precursor vaporizing apparatus in accordance with the present invention.

As shown in FIG. 1, vapor deposition system 10 includes the vaporization apparatus 12 and process chamber 14. The present invention may be utilized with various CVD process chambers including, but not limited to, hot wall or cold wall reactors, atmospheric or reduced pressure reactors, as well as plasma enhanced reactors. Further, the present invention is advantageous for vaporization and delivery of many different solid and liquid precursors to a process chamber in the CVD process. Therefore, the present invention is not limited to any particular solid or liquid precursor, but is limited only in accordance with the invention as described in the accompanying claims.

The vaporization apparatus 12 includes a vaporization zone 20 defined by vaporization chamber or housing 18. The vaporization zone 20 may be heated. Vaporization chamber 18 includes a first port 40 for positioning of electrostatic dispensing device 16 in order to provide precursor spray 17 into the vaporization zone 20. The vaporization chamber 18 further includes port 42 for receiving a carrier gas 22 which is utilized to move vaporized precursor spray from vaporization zone 20 into the process chamber 14. As shown in FIG. 1, the carrier gas 22 moves the vaporized precursor spray through heated gas line 28 to directing device 32. The directing device 32 may include any known means of directing the vaporized precursor spray from the heated gas line 28 into the process chamber 14 for deposition of a film or layer on a surface of a wafer 15 or any other device structure. As shown in FIG. 1, the directing device 32 is a shower head device.

It should be readily apparent to one skilled in the art that various components of the vaporization apparatus 12 may be heated or unheated. For example, the heated carrier gas may be heated prior to being received in vaporization zone 20. Further, for example, the gas line 43 to port 42 of vaporization chamber 18 may also be heated.

The electrostatic dispensing device 16 generates precursor spray 17. The precursor spray includes high surface area microdroplets or high surface area particles. In one embodiment, the electrostatic dispensing device 16 is an electrostatic sprayer 50 such as an electrostatic powder spray system available from Nordson, Inc. of Amherst, Ohio, sold under the trade designation of Versa-Spray II Manual Powder System which allows for the precise control of powder flow, gas flow, and electrostatic parameters for producing a charged precursor spray 17. The electrostatic powder spray system is utilized to provide a precursor spray utilizing precursor supply 26 and inert gas supply 24. With an electrostatic powder spray system, a precursor spray of high surface area charged particles is provided. The precursor supply 26 for use with the electrostatic powder spray system may include a powdered precursor, a mixture of powdered precursors, one or more powdered precursors cut with an inert filler material, one or more liquid precursors adsorbed on solid particles, or one or more gas precursors adsorbed on solid particles. For example, the solid precursor may be cut with an inert filler material such as alumina or silica. Further, liquid precursors or gas precursors may be adsorbed on solid particles such as, for example, zeolites.

Various solid precursors may be utilized as the supply precursor 26. For example, such solid powder precursors may include cyclopentadienyl cycloheptatrienyl titanium, or dicyclooctatetraene titanium, such as, for example, in the deposition of metal nitrides, or other metal-based films. Further, such powdered precursors may include, for example, aluminum isopropoxide, barium bis (tetramethylheptanedionate), or strontium bis (tetramethylheptanedionate). However, the present invention is applicable to any solid powdered precursor material to be delivered in a CVD process and is not limited to any particles or material described or listed herein but is limited only as described in the accompanying claims.

The electrostatic sprayer 50 is electrically connected to a power supply 51 for providing the necessary voltage to be applied, for example, at a nozzle 52 of the electrostatic sprayer 50 such that the particles of the precursor spray 17 are electrically charged, i.e., with a negative charge. The charge applied to the particles need only be such that the charged particles are attracted to the heated element 30 for vaporization. For example, commercially available sprayers may use a voltage of 100,000 volts DC to charge particles or microdroplets dispensed from the nozzle of the sprayer. Further, the electrostatic sprayer 50 is provided with an inert gas supply 24 which is a pressurized supply necessary for discharge of the precursor spray 17 from the electrostatic sprayer 50 into the vaporization zone 20. The inert gas may be any gas nonreactable with the precursor being delivered such as, for example, nitrogen, helium, or argon. Further, the inert gas may be preheated.

In another embodiment, the electrostatic dispensing device 16 for providing the charged precursor spray 17 may include an electrostatic sprayer 50 such as a sprayer available from Binks, Franklin Park, Ill. Such an electrostatic sprayer may be utilized to spray microdroplets utilizing a liquid precursor supply 26. For example, the liquid precursor supply may be any liquid precursor, a mixture of liquid precursors, or one or more solid precursors dissolved in one or more solvents. For example, the liquid precursor supply may include any of the liquid precursors listed herein and any other liquid precursor to be delivered in a CVD process. Many liquid precursors are available in addition to many various solid precursors that can be dissolved in various solvents and the present invention is not limited to any particular liquid precursor or solid precursor dissolved in a solvent but is only limited in accordance with the accompanying claims.

If a pressurized precursor supply 26 is utilized, an airless electrostatic spray gun available from Binks may be utilized. As shown in FIG. 1, if an airless electrostatic spray gun 50 is utilized to provide the precursor spray 17, the inert gas supply 24 would be unnecessary as only a pressurized precursor supply 26 is required for discharging the precursor spray 17 from the nozzle 52 of the electrostatic sprayer.

In addition, an electrostatic air atomizing spray gun from Binks may be utilized. If an electrostatic air atomizing spray gun available from Binks is utilized, then an inert gas supply 24 is provided to the electrostatic spray gun, i.e., the inert gas supply 24 would be provided to the same port as normally or typically utilized for air in other applications.

It should be readily apparent to one skilled in the art that any electrostatic dispensing device 16 which generates a precursor spray having electrostatic charge applied to the microdroplets or particles of the precursor spray may be utilized in accordance with the present invention. The electrostatic dispensing device 16 provides a precursor spray 17 of charged microdroplets or particles adequate for vaporization in the vaporization zone 20 of the present invention. The dimension of the microdroplets or particles adequate for vaporization depends on various factors such as the precursor utilized, whether the precursor is preheated prior to dispersement into the vaporization zone, the vapor pressure of components in the precursor, the pressure in the vaporization zone, and decomposition temperatures of the precursor or components of the precursor. For example, generally a microdroplet may be defined as any droplet having a nominal diameter of less than about 1,000 micrometers. However, preferably, the nominal diameter of the microdroplets is less than 100 micrometers for providing a higher surface area for vaporization. The size of spray particles, generally, is such that the surface area of the particles is within the same range as the surface area provided by the range of microdroplet diameters described above.

The precursor supply 26 may also include a flow controller such as, for example, commonly available mass flow controllers suitable to provide a flow of precursor to the electrostatic sprayer 50. By including a flow controller, the flow of precursor to the electrostatic dispensing device 16 may be performed in a reproducible fashion. The nozzle 52 of electrostatic sprayer 50 is sealingly positioned with its open end tip extending into vaporization zone 20 to provide the charged precursor spray 17 therein.

The open end tip of nozzle 52 is positioned such that the precursor spray is discharged into the vaporization zone 20 at a location that is proximate the charged and heated element 30. As shown in FIG. 1, the heated element 30 is positioned directly in front of the nozzle 52 of the electrostatic dispensing device 16. The location of the nozzle 52 with respect to the heated element 30 will vary depending upon the diameter of the spray, the size of the heated element, and the distance between the nozzle 52 and heated element 30. The spray diameter can be adjusted for any size heated element by adjustment of the nozzle. One preferred location is such that the spray covers the entire heated element. For example, the spray diameter in such a location would be substantially equal to the diameter of the heated element such that overspray is prevented and maximum contact between the spray and heated element occurs.

The heated element 30 may take various configurations and be formed of aluminum, stainless steel, or any other suitable heat conductive material. For example, the heated element 30 may be a positively charged plate, i.e., connected to ground. Further, the heated element 30 may include a plurality of various elements separated so as to provide a greater surface area for contact with and vaporization of the precursor spray. For example, the heated elements 30 may include a baffle-like structure wherein a plurality of elements are separated such that precursor spray can flow between the elements. However, any configuration for the heated element 30 may be suitable for use in accordance with the present invention including, but not limited to, a plurality of disks, baffles, flat surfaces, non-planar surfaces, planar surfaces, plates having a plurality of grooves therein to increase the surface area, or any other structure that increases the surface area for vaporization of the precursor spray as would be readily known to one skilled in the art.

As shown in FIG. 1, the heated element 30 is connected to ground to provide a positive charge thereon, i.e., opposite of the precursor spray 17. The temperature of the heated element 30 will vary depending upon the necessary heat required to flash vaporize the precursor spray 17 selected to be utilized for CVD. Further, the pressure of the pressurizable vaporization chamber 18 can be utilized, along with the temperature of the heated element 30, to control the amount of vaporized precursor delivered to the process chamber 14.

In accordance with the present invention, the precursor spray 17 having a first charge thereon, i.e., negative, is provided into vaporization zone 20 utilizing the electrostatic dispensing device 16. The heated element 30 having a second electrical charge thereon, i.e., positive charge, draws the charged precursor spray 17 to the heated element 30 and the precursor spray sticks thereto such that there is substantially no overspray. The precursor spray drawn to the heated element 30 is vaporized and the carrier gas 22 is utilized to move the vaporized precursor spray into processing chamber 14. The present invention contemplates the use of any two electrical charges on the precursor spray 17 and heated element 30, respectively, such that the precursor spray 17 is attracted to element 30. For example, either the precursor spray 17 or the heated element 30 may be positively charged while the other is the opposite thereof.

Preferably, the vaporization chamber 18 includes walls that are heated by heating elements to maintain the temperature of the vaporized precursor spray therein such that condensation of any precursor on the walls of the vaporization chamber 18 is deterred. However, as the precursor spray 17 is substantially completely attracted to the heated element 30, unvaporized precursor is typically unavailable reducing the collection of such precursor on the walls of the vaporization chamber 18.

As would be apparent to one skilled in the art, the vaporization zone 20 may be directed into one or more process chambers 14 by one or more directing devices 32 such as, for example, the shower head device as shown in FIG. 1. For example, precursor vaporization apparatus 12 may be utilized for directing a vaporized precursor spray into a single process chamber or, for example, a single vaporization zone with multiple directing devices may be utilized for directing the vaporized precursor spray from one vaporization zone into several process chambers. Further, multiple vaporization apparatus 12 may be utilized for directing multiple vaporized precursor sprays into a single process chamber.

Also, as would be apparent to one skilled in the art, other reactants or reactant gases may be introduced in the vapor deposition system 10 in various manners and at various points in the system. For example, reactants or reacting gases such as, for example, oxygen, nitrous oxide, ammonium, water vapor, hydrogen sulphide, hydrogen silicide, hydrogen telluride, etc., and mixtures thereof, can be introduced into the process chamber 14 separately from the vaporized precursor spray, introduced into the system in combination with the vaporized precursor spray, introduced into the system in combination with the carrier gas (i.e., carrier gas 22), introduced into the vaporization zone to combine with the vaporized precursor spray, or in any combination thereof.

Figure 2:
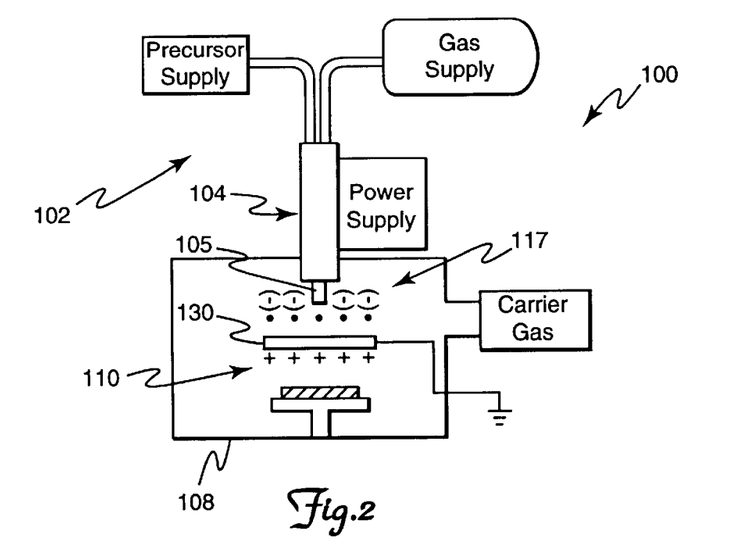
FIG. 2 is a block diagram illustration of an alternative configuration of the vapor deposition system shown in FIG. 1, wherein the vaporization zone is within the process chamber.

FIG. 2 shows an alternative configuration of the vapor deposition system 10 in accordance with the present invention. The vapor deposition system 100 is similar to the vapor deposition system 10 as shown in FIG. 1. For example, vaporization apparatus 102 is substantially the same as vaporization apparatus 12. However, vaporization apparatus 102 does not include a heated gas line 28 or a directing device 32. Further, although the nozzle 105 of electrostatic dispensing device 104 is substantially the same as electrostatic dispensing device 16, it is positioned for providing precursor spray 117 directly into deposition chamber 108. With the heated element 130 located in the process chamber 108, the vaporization zone 110 is within the process chamber 108 as opposed to a separate vaporization chamber 18 (FIG. 1). In this configuration, the heated gas line of FIG. 1 is unnecessary.

Figures 3, 4:
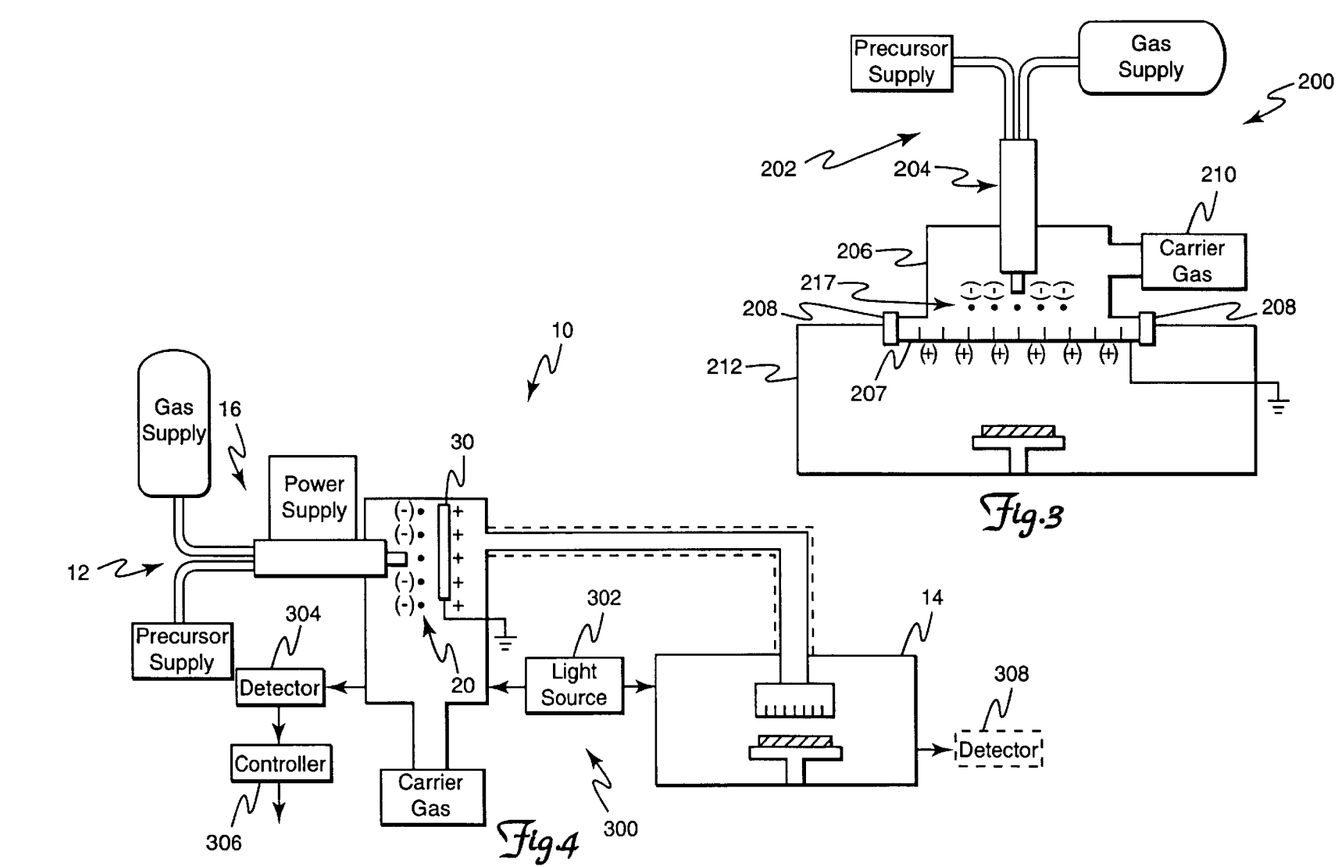
FIG. 3 is a block diagram illustration of a further alternative configuration of the vapor deposition system shown in FIG. 1, wherein a directing device for directing a vaporized precursor into a process chamber is utilized as the heated and charged element in accordance with the present invention.
FIG. 4 is a block diagram illustration of the vapor deposition system as shown in FIG. 1, further including a detection system in accordance with the present invention.

FIG. 3 shows another alternative configuration of the vapor deposition system 10 in accordance with the present invention. The vapor deposition system 200 includes a shower head device 206 which includes a heated and electrically charged portion 207. The electrostatic dispensing device 204 of the vaporization apparatus 202 is positioned for providing the precursor spray 217 directly into the shower head device 206. The shower head device 206, as it is electrically charged, is electrically isolated using insulating material 208 thereabout. The precursor spray 217, having a charge opposite of the portion 207 of shower head device 206, is attracted to the portion 207 and flash vaporized thereby in the same manner as the heated element 30 flash vaporizes the charged precursor spray 17 as shown in FIG. 1. By heating and electrically charging a portion 207 of the shower head device 206, the preheated gas line 28, and the vaporization zone 20 separated from the process chamber 14, as shown in FIG. 1, are unnecessary. A carrier gas 210 may be provided into a port of the shower head device 206 to move the vaporized precursor spray into the process chamber 212.

The embodiment as shown in FIG. 4 includes all the elements of the embodiment of FIG. 1 and further includes a detection system 300 which may be utilized to detect unvaporized precursor spray or to detect particulates that would be detrimental to the growth of the film in the process chamber 14. The information resulting from such detection may then be used by controller 306 for manipulating the vaporization apparatus 12 via a feedback loop, or manual adjustment based on such information may also be performed. The information detected may be used to control various parameters of the vapor deposition system. For example, it may be utilized to adjust the temperature of the heated element 30, to adjust the pressure of the pressurizable vaporization chamber 18, to adjust the charge applied to the precursor spray or the heated element 30, to vary the distance between the heated element 30 and the electrostatic dispensing device 16, or to adjust the flow of precursor from precursor supply 26 if a flow controller is used. Further, for example, the various electrostatic spraying devices which may be used with the present invention may include various control features that may be controllable using the information detected.

With reference to FIG. 4, the detection system 300 includes a light source 302 for impingement upon vaporized and unvaporized precursor within the vaporization zone 20. Light scattered by the vaporized and unvaporized precursor is detected by detector 304, for example, a photodiode. The detector 304 then generates an electrical signal and provides a signal to controller 306 indicating the concentration of the unvaporized precursor or detection of particulates that may be detrimental to the CVD process.

Further, although not shown, a diverter may be utilized for diverting a portion of the vaporized precursor into a flow cell which could then be utilized to determine the concentration therein. For example, a light source may be shown through a window of the flow cell and a detector utilized to detect the light scattered by the unvaporized and vaporized precursor spray or particulates therein.

Alternatively, rather than utilizing the vaporization zone 20 or a flow cell in the detection system, the vaporized and unvaporized precursor may be detected in the process chamber 14. For example, as shown in FIG. 4, the light source 302 of the detection system 300 may be directed through a window in the process chamber 14 and impinge on the vaporized and unvaporized precursor spray in the process chamber 14 with a detector 308 for detecting light scattered by the constituency in the process chamber 14. It would be readily apparent that the detection of unvaporized precursor, vaporized precursor or particulates therein may be performed at any in-line point of the vaporization process or vaporization zone where desired. Such detection systems may include elements or systems of commonly available concentration detection systems as are known to those skilled in the art, such as those available from Alltech, Dearfield, Ill.

The controller 306 may be utilized to control the vaporization apparatus 12 in a variety of manners. For example, the controller may be utilized to adjust the pressure of the vaporization zone 20 or may be utilized to adjust the temperature of the heated element 30. In this manner, the amount of vaporized precursor delivered to the process chamber can be precisely controlled. As one skilled in the art would recognize, any temperature modification available within the vaporization apparatus 12 could be controlled for providing more adequate vaporization of the precursor spray 17 within the heated vaporization zone 20 in response to the detection of unvaporized precursor spray. In addition, the detected concentration could also be utilized to control the flow of precursor from precursor supply 26 to the electrostatic dispensing device 16 such as, for example, utilizing a mass flow controller. Likewise, the detected concentration could be used to adjust the distance between the heated element and dispensing device, i.e., by movement of the heated element or dispensing device.

As would be known to one skilled in the art, the orientation, i.e., vertical, horizontal, of the various elements of the vaporization apparatus 12 including the directing device 32 may take one of any number of configurations. For example, the vaporization zone may be vertical as opposed to being horizontal, the heated carrier gas line may be vertical as opposed to being horizontal, the shower head may be positioned such that the vapor is directed upward as opposed to being directed downward, as well as other changes in the configuration as would be known to one skilled in the art.

Also, as would be known to one skilled in the art, the ranges for various parameters of the system, including the heat necessary to vaporize the precursor spray 17, is highly dependent upon the precursor utilized. Each precursor will have different ranges of such parameters and other applicable system parameters. Because the invention as described herein is not limited to any particular precursor, the heat necessary to vaporize the precursor, and other parameters such as the pressure of the vaporization zone, vary depending upon the application of the apparatus.

Although the present invention has been described with particular reference to various embodiments thereof, variations and modifications of the present invention can be made within the contemplated scope of the following claims as is readily known to one skilled in the art.

What is claimed is:

1. A vaporizing apparatus for providing a vaporized precursor for a vapor deposition process, the apparatus comprising:
   a dispensing device for providing precursor spray having a first electrical charge into a vaporization zone; and
   a heated element in the vaporization zone having a second electrical charge opposite of the first charge, the heated element for vaporizing the precursor spray attracted thereto.

2. The apparatus according to claim 1, wherein the vaporization zone includes a housing defining a vapor flow path from the dispensing device to a process chamber, the vaporization zone for receiving a carrier gas, the carrier gas for moving the vaporized precursor spray into the process chamber.

3. The apparatus according to claim 1, wherein the vaporization zone is located at least in part within the process chamber.

4. The apparatus according to claim 1, wherein the heated element includes a plurality of elements spaced for providing precursor spray flow therebetween.

5. The apparatus according to claim 1, wherein the apparatus includes a directing device to direct the vaporized precursor from the vaporization zone into the process chamber, and further wherein the directing device is the heated element having the second charge.

6. The apparatus according to claim 1, wherein the dispensing device is an electrostatic spray device for spraying a precursor selected from the group consisting of a powdered precursor, a mixture of powdered precursors, one or more powdered precursors cut with an inert filler material, one or more liquid precursors adsorbed on solid particles, one or more gas precursors adsorbed on solid particles, a liquid precursor, a mixture of liquid precursors, and one or more solid precursors dissolved in one or more solvents.

7. The apparatus according to claim 1, wherein the apparatus further includes a detection device for detecting the concentration of unvaporized precursor spray.

8. The apparatus according to claim 7, wherein the detection device includes means for generating a signal representative of the concentration of unvaporized precursor spray, and further wherein the apparatus includes a controller responsive to the signal representative of the detected concentration for initiating modification of a parameter of the vaporizing apparatus.

9. The apparatus according to claim 8, wherein the apparatus further includes means for modifying one of a flow of precursor spray, a temperature of the heated element, a pressure of the vaporization zone, a distance between the heated element and dispensing device, the first electrical charge, and the second electrical charge.

10. A method of vaporizing precursors for vapor deposition processes, the method comprising the steps of:
    providing a precursor spray having a first electrical charge; and
    vaporizing at least a portion of the precursor spray using a heated element having a second electrical charge opposite of the first electrical charge.

11. The method according to claim 10, wherein the providing step includes applying the first electrical charge to a precursor as it is sprayed into a vaporization zone; and further wherein the vaporization step includes attracting the charged precursor spray to the heated element for vaporization thereby.

12. The method according to claim 11, further including the step of moving the vaporized precursor spray using a carrier gas into one or more process chambers having one or more deposition surfaces positioned therein.

13. The method according to claim 10, wherein the precursor spray is formed from a precursor selected from the group consisting of a powdered precursor, a mixture of powdered precursors, one or more powdered precursors cut with an inert filler material, one or more liquid precursors adsorbed on solid particles, one or more gas precursors adsorbed on solid particles, a liquid precursor, a mixture of liquid precursors, and one or more solid precursors dissolved in one or more solvents.

14. The method according to claim 10, wherein the method further comprises the step of controlling the vaporization step by adjusting the temperature of the heated element.

15. The method according to claim 10, wherein the method further comprises the step of controlling the vaporization step by adjusting the pressure of a vaporization zone receiving the precursor spray.

16. A vapor deposition system comprising:
    an electrostatic spraying device for providing a precursor spray having a first electrical charge;
    a housing defining a vaporization zone, the housing including a heated element therein having a second electrical charge for attracting the precursor spray from the electrostatic spraying device and for vaporization of the precursor spray; and
    a process chamber for receiving the vaporized precursor spray from the vaporization zone.

17. The system according to claim 16, wherein the vaporization zone, including the heated element therein, is located at least in part within the process chamber.

18. The system according to claim 16, wherein the heated element includes a plurality of elements separated for flow of precursor spray therebetween.

19. The system according to claim 16, wherein the system further includes a directing device to direct the vaporized precursor from the vaporization zone into the process chamber, and further wherein the directing device is the heated element having the second charge and which attracts and vaporizes the precursor spray.

20. A method of vaporizing precursors for vapor deposition processes, the method comprising the steps of:
    providing electrically charged precursor powder particles;
    attracting the charged powder precursor particles to a heated element having a charge opposite of the charged precursor powder particles; and vaporizing the charged precursor powder particles with the heated element.

21. A method of vaporizing precursors for vapor deposition processes, the method comprising the steps of:

providing electrically charged precursor microdroplets;

attracting the charged precursor microdroplets to a heated element having a charge opposite of the charged precursor microdroplets; and vaporizing the charged precursor microdroplets using the heated element.

22. A method of controlling the vaporization of precursors for vapor deposition processes, the method comprising the steps of:

using an electrically charged and heated element to attract thereto and to vaporize a precursor spray of opposite charge;

detecting the concentration of unvaporized precursor spray; and controlling the vaporization of the precursor spray as a function of the detected concentration.

23. The method according to claim 22, wherein the controlling step includes controlling one of a temperature of the heated element, the charge of the heated element, the charge of the precursor spray, a distance between the heated element and a dispensing device used for providing the precursor spray, and a pressure of a vaporization chamber into which the precursor spray is sprayed and in which the precursor is vaporized.

24. A vaporizing apparatus for providing a vaporized precursor to a process chamber in a vapor deposition process, the apparatus comprising:

an electrostatic dispensing device for providing precursor spray having a first electrical charge;

a pressurizable chamber defining a vaporization zone for receiving the electrically charged precursor spray and a carrier gas; and a heated element in the vaporization zone having a second electrical charge opposite of the first charge, the heated element for vaporizing the precursor spray attracted thereto, the carrier gas for moving the vaporized precursor spray into the process chamber.

* * * * *